(12) United States Patent
Lee

(10) Patent No.: US 7,606,280 B2
(45) Date of Patent: Oct. 20, 2009

(54) METHOD OF PRODUCING MULTI-WAVELENGTH SEMICONDUCTOR LASER DEVICE

(75) Inventor: Sang Don Lee, Kyungki-Do (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 209 days.

(21) Appl. No.: 11/857,192

(22) Filed: Sep. 18, 2007

(65) Prior Publication Data

US 2008/0009088 A1    Jan. 10, 2008

Related U.S. Application Data

(62) Division of application No. 10/933,532, filed on Sep. 3, 2004, now abandoned.

(30) Foreign Application Priority Data

Jun. 25, 2004    (KR) ............................. 2004-48079

(51) Int. Cl.
*H01S 5/00* (2006.01)
*H01L 21/00* (2006.01)

(52) U.S. Cl. ............... 372/50.121; 372/50.12; 372/50.122; 438/29; 438/34; 438/35; 438/46; 438/47

(58) Field of Classification Search ............... 372/50.12, 372/50.121, 50.122; 438/29, 34, 35, 46, 438/47
See application file for complete search history.

(56) References Cited

U.S. PATENT DOCUMENTS

| | | | |
|---|---|---|---|
| 5,039,627 A * | 8/1991 | Menigaux et al. ............. 438/35 |
| 5,042,043 A * | 8/1991 | Hatano et al. ........... 372/45.012 |
| 5,386,428 A * | 1/1995 | Thornton et al. ......... 372/50.12 |
| 5,436,193 A * | 7/1995 | Beernink et al. ............... 438/34 |
| 5,701,321 A * | 12/1997 | Hayafuji et al. ......... 372/44.011 |
| 5,777,350 A * | 7/1998 | Nakamura et al. ............ 257/96 |
| 5,804,834 A * | 9/1998 | Shimoyama et al. .......... 257/22 |
| 6,100,546 A * | 8/2000 | Major et al. ................. 257/103 |
| 6,285,696 B1 * | 9/2001 | Bour et al. ................ 372/45.01 |
| 6,285,698 B1 * | 9/2001 | Romano et al. .......... 372/46.01 |
| 6,303,403 B1 * | 10/2001 | Sato et al. ..................... 438/29 |

(Continued)

FOREIGN PATENT DOCUMENTS

JP    9-307145 A    11/1997

(Continued)

OTHER PUBLICATIONS

Japanese Patent Office, Office Action mailed Nov. 21, 2006.

*Primary Examiner*—Wael Fahmy
*Assistant Examiner*—Hrayr A Sayadian
(74) *Attorney, Agent, or Firm*—Lowe Hauptman Ham & Berner

(57) ABSTRACT

A method for producing a multi-wavelength semiconductor laser device includes steps of: forming first and second nitride epitaxial layers in parallel on a substrate for growth of a nitride single crystal; separating the first and second nitride epitaxial layers from the substrate; attaching the separated first and second nitride epitaxial layers to a first conductivity-type substrate; selectively removing the first and second nitride semiconductor epitaxial layers to expose a portion of the first conductivity-type substrate and to form first and second semiconductor laser structures, respectively; and forming a third semiconductor laser structure on the exposed portion of the first conductivity-type substrate.

13 Claims, 7 Drawing Sheets

U.S. PATENT DOCUMENTS

| | | | |
|---|---|---|---|
| 6,323,053 B1 * | 11/2001 | Nishikawa et al. | 438/46 |
| 6,455,340 B1 * | 9/2002 | Chua et al. | 438/31 |
| 6,465,812 B1 * | 10/2002 | Hosoba et al. | 257/103 |
| 6,480,456 B1 * | 11/2002 | Kawamura et al. | 369/120 |
| 6,995,406 B2 * | 2/2006 | Tojo et al. | 257/103 |
| 7,034,857 B2 * | 4/2006 | Mori et al. | 347/228 |
| 7,153,715 B2 * | 12/2006 | Ueda | 438/46 |
| 2001/0042866 A1 * | 11/2001 | Coman et al. | 257/103 |
| 2001/0050531 A1 * | 12/2001 | Ikeda | 313/498 |
| 2003/0122141 A1 * | 7/2003 | Wong et al. | 257/88 |
| 2003/0222263 A1 * | 12/2003 | Choi | 257/79 |
| 2004/0026703 A1 * | 2/2004 | Adomi et al. | 257/81 |
| 2004/0196877 A1 * | 10/2004 | Kawakami et al. | 372/23 |
| 2004/0262617 A1 * | 12/2004 | Hahm et al. | 257/79 |

FOREIGN PATENT DOCUMENTS

| | | | |
|---|---|---|---|
| JP | 11026877 A | * | 1/1999 |
| JP | 11-307818 A | | 11/1999 |
| JP | 2002-118331 A | | 4/2002 |
| JP | 2003-15222 A | | 5/2003 |
| KR | 2004-05269 | | 1/2004 |

* cited by examiner

METHOD OF PRODUCING MULTI-WAVELENGTH SEMICONDUCTOR LASER DEVICE

RELATED APPLICATIONS

The present application is a division of U.S. application Ser. No. 10/933,532, filed Sep. 3, 2007, which claims priority from, Korea Application Number 2004-48079, filed Jun. 25, 2004, the disclosures of which are hereby incorporated by reference herein in their entirety.

BACKGROUND OF THE INVENTION

1. Field of the Invention

The present invention relates to a multi-wavelength semiconductor laser device, and more particularly to a multi-wavelength semiconductor laser device capable of simultaneously or selectively oscillating laser light of three different wavelengths (e.g., 460 nm, 530 nm and 635 nm), and a method for producing the multi-wavelength semiconductor laser device.

2. Description of the Related Art

In general, a semiconductor laser device is one that produces light amplified by stimulated emission of radiation. The light produced by the semiconductor laser device has a narrow frequency width (one of short-wavelength characteristics), superior directivity and high output. Due to these advantages, the semiconductor laser device is used as a light source for an optical pick-up apparatus of an optical disc system, such as a CD (compact disc) or DVD (digital video disc) player, as well as, is widely applied to a wide range of fields of optical communications multiplex communications, space communications and the like.

In recent years, a multi-wavelength semiconductor laser device capable of oscillating two or more different wavelengths has been required in the field of optical discs using laser as a light source for writing and reading information. For example, a two-wavelength semiconductor laser device is currently developed as a light source for both CD players having a relatively low data density and DVD players having a relatively high data density.

FIGS. 1a to 1g are cross-sectional views illustrating the overall procedure of a conventional method for producing a two-wavelength semiconductor laser device.

Referring to FIG. 1a, a first semiconductor laser epitaxial layer oscillating light at a wavelength of 780 nm is formed on an n-type GaAs substrate 11. Specifically, the first semiconductor laser epitaxial layer is formed by sequentially growing an n-type AlGaAs clad layer 12a, an AlGaAs active layer 13a and a p-type AlGaAs clad layer 14a on the GaAs substrate 11.

Thereafter, the first semiconductor laser epitaxial layer, including the layers 12a, 13a and 14a, is selectively removed by photolithography and etching to expose a portion of a top surface of the GaAs substrate 11, as shown in FIG. 1b.

Next, as shown in FIG. 1c, a second semiconductor laser epitaxial layer oscillating light at a wavelength of 650 nm is formed on the exposed portion of the GaAs substrate 11 and the unremoved portion of the first semiconductor laser epitaxial layer. Specifically, the second semiconductor laser epitaxial layer is formed by sequentially growing an n-type AlGaInP clad layer 12b, a GaInP/AlGaInP active layer 13b and a p-type AlGaInP clad layer 14b.

Thereafter, the second semiconductor laser epitaxial layer, including the layers 12b, 13b and 14b, formed on the first semiconductor laser epitaxial layer is removed by photolithography and etching, and at the same time, the first epitaxial layer is separated from the second epitaxial layer, as shown in FIG. 1d.

Next, as shown in FIG. 1e, the p-type AlGaAs clad layer 14a and the p-type AlGaInP clad layer 14b are selectively etched by a common process to form ridge-shaped layers 14a' and 14b', which contribute to an improvement in current injection efficiency. Then, as shown in FIG. 1f, n-type GaAs current-limiting layers 16a and 16b and p-type GaAs contact layers 17a and 17b are formed.

Finally, as shown in FIG. 1g, p-side electrodes 19a and 19b formed of Ti, Pt, Au or an alloy thereof are formed on the p-type GaAs contact layers 17a and 17b, respectively, and then an n-side electrode 18 formed of Au/Ge, Au, Ni or an alloy thereof is formed on a bottom surface of the GaAs substrate 11 to produce the two-wavelength semiconductor laser device 10.

In this manner, the semiconductor laser device 10 oscillating light of two different wavelengths is produced on a single substrate, enabling integration into one chip. Accordingly, the conventional method is advantageous compared to a method wherein respective semiconductor laser devices are separately produced, and are then attached to one substrate by die bonding, in terms of the following advantages: i) the separate production and bonding processes are omitted, thus shortening the overall production procedure, and ii) poor alignment caused during die bonding of chip can be solved.

As explained earlier in FIGS. 1a to 1g, the conventional method is limited to the two-wavelength (650 nm and 780 nm) semiconductor laser device, and thus cannot be applied to a three-wavelength (further including light of a short wavelength) semiconductor laser device. For example, two laser structures composed of nitride epitaxial layers oscillating light at wavelengths of 460 nm and 530 nm, and one laser structure composed of an AlGaInP-based epitaxial layer oscillating light at a wavelength of 635 nm are required to produce a multi-wavelength semiconductor laser device oscillating red, green and blue light. In this connection, there is a problem that since GaN-based epitaxial layers are particularly required to produce a semiconductor laser device oscillating light at wavelengths of 460 nm and 530 nm, they cannot be formed on the same substrate, together with a semiconductor laser structure oscillating light at a wavelength of 635 nm.

More specifically, since there is a large difference in the lattice constant between the AlGaInP epitaxial layer (about 5.6 Å) and the GaN epitaxial layer (about 3.2 Å) for the semiconductor laser structure oscillating light at a wavelength of 635 nm, it is difficult to grow the AlGaInP and GaN epitaxial layers on the same substrate. The AlGaInP epitaxial layer can be formed with superior crystallinity on a GaAs substrate, whereas the GaN epitaxial layer can be formed with superior crystallinity only on substrates for growth of a nitride semiconductor, such as GaN, sapphire and SiC substrates. Consequently, a multi-wavelength semiconductor laser device oscillating three-color light, for example, at wavelengths of 460 nm, 530 nm and 635 nm, cannot be substantially produced by the conventional method for producing a two-wavelength semiconductor laser device.

SUMMARY OF THE INVENTION

Therefore, the present invention has been made in view of the above problems, and it is an object of the present invention to provide a method for producing a multi-wavelength semiconductor laser device oscillating light of three different wavelengths by growing GaN epitaxial layers on a separate substrate, followed by separation and attachment.

It is another object of the present invention to provide a multi-wavelength semiconductor laser device having a novel structure which is produced by the method.

In order to accomplish the above objects of the present invention, there is provided a method for producing a multi-wavelength semiconductor laser device, comprising the steps of: preparing a substrate for growth of a nitride single crystal thereon; sequentially growing a first conductivity-type first clad layer, a first active layer and a second conductivity-type first clad layer on the substrate, to form a first nitride epitaxial layer; selectively removing the first nitride epitaxial layer such that a portion of the substrate is exposed; sequentially growing a first conductivity-type second clad layer, a second active layer and a second conductivity-type second clad layer on the exposed portion of the substrate, to form a second nitride epitaxial layer; separating the first and second nitride epitaxial layers from the substrate; attaching the separated first and second nitride epitaxial layers to a first conductivity-type substrate; selectively etching the first and second nitride semiconductor epitaxial layers to expose a portion of the first conductivity-type substrate and to form first and second semiconductor laser structures from the first and second nitride epitaxial layers, respectively, the first and second semiconductor laser structures being separated from each other; sequentially growing a first conductivity-type third clad layer, a third active layer and a second conductivity-type third clad layer on the exposed portion of the first conductivity-type substrate, to form a third semiconductor laser structure; and forming a first electrode connected to a bottom surface of the first conductivity-type substrate and forming second electrodes connected to the respective second conductivity-type clad layers of the first, second and third semiconductor laser structures.

In a preferred embodiment of the present invention, the method of the present invention further comprises the steps of: selectively etching the respective second conductivity-type clad layers of the first, second and third semiconductor laser structures, after the formation of the third semiconductor laser structure and before the formation of the first electrode and the second electrodes, to form ridge-shaped layers; and forming an insulating layer on top surfaces of the second conductivity-type clad layers except for top ends of the ridge-shaped layers. In this case, the second electrodes can be connected to the respective second conductivity-type clad layers through the respective top ends of the ridge-shaped layers.

More preferably, the insulating layer may be formed in such a manner that it is extended to side faces of the first, second and third semiconductor laser structures. The insulating layer may be formed of $SiO_2$ or $Si_3N_4$.

In addition, the separation of the first and second nitride epitaxial layers from the substrate can be performed by irradiating the bottom surface of the substrate with laser light to lift-off the first and second nitride epitaxial layers. More preferably, the method of the present invention may further comprise the step of lapping the bottom surface of the substrate for growth of a nitride single crystal, before the laser irradiation, to decrease the thickness of the substrate.

Further, the attachment of the first and second nitride epitaxial layers to the first conductivity-type substrate can be performed by applying pressure to the first and second nitride epitaxial layers on a top surface of the first conductivity-type substrate at high temperature.

The etching of the first nitride semiconductor layer leaves only an epitaxial layer for the first semiconductor laser structure. The formation of the third semiconductor laser structure can be realized by the sub-steps of: sequentially growing the first conductivity-type third clad layer, the third active layer and the second conductivity-type third clad layer on the top surface of the first conductivity-type substrate on which the first and second semiconductor laser structures are formed, to form an epitaxial layer for the third semiconductor laser structure; and selectively etching the epitaxial layer for the third semiconductor laser structure, to form the third semiconductor laser structure separated from the first and second semiconductor laser structures on a portion of the first conductivity-type substrate.

Further, in order to facilitate the subsequent growth step, the first, second and third semiconductor laser structures are preferably arranged in order that they grow. Namely, it is preferable that the first, second and third semiconductor laser structures are formed in this order from one side of the first conductivity-type substrate.

The substrate for growth of a nitride single crystal may be a sapphire, SiC, or GaN substrate, the first nitride epitaxial layer may be formed of a GaN-based semiconductor material for a semiconductor laser structure oscillating blue light, and the second nitride epitaxial layer may be formed of a GaN-based semiconductor material for a semiconductor laser structure oscillating green light.

On the other hand, the third semiconductor laser structure may be formed of an AlGaInP-based semiconductor material oscillating red light.

In accordance with another aspect of the present invention, there is provided a multi-wavelength semiconductor laser device having a novel structure. The multi-wavelength semiconductor laser device comprises: a first conductivity-type substrate having a top surface divided into first, second and third regions; a first semiconductor laser structure oscillating blue light, the first semiconductor laser structure including a first conductivity-type first GaN-based clad layer, a first GaN-based active layer and a second conductivity-type first GaN-based clad layer sequentially formed on the first region of the first conductivity-type substrate; a second semiconductor laser structure oscillating green light, the second semiconductor laser structure including a first conductivity-type second GaN-based clad layer, a second GaN-based active layer and a second conductivity-type second GaN-based clad layer sequentially formed on the second region of the first conductivity-type substrate; a third semiconductor laser structure including a first conductivity-type AlGaInP-based clad layer, an AlGaInP-based active layer and a second conductivity-type AlGaInP-based clad layer sequentially formed on the third region of the first conductivity-type substrate; and a first electrode connected to a bottom surface of the first conductivity-type substrate and second electrodes connected to the respective second conductivity-type clad layers of the first, second and third semiconductor laser structures.

In order to integrate the semiconductor laser structures composed of the respective epitaxial layers, which are grown under different conditions, into one chip, the multi-wavelength semiconductor laser device of the present invention is produced by forming the respective nitride epitaxial layers for the first and second semiconductor laser structures oscillating light of short wavelengths, separating the nitride epitaxial layers from each other, attaching the separated epitaxial layers to the first conductivity-type substrate, and forming the third semiconductor laser structure on the first conductivity-type substrate. Particularly, according to the method of the present invention, since the nitride epitaxial layers grown at a relatively high temperature are formed, separated from the substrate and attached to the first conductivity-type substrate, unwanted effects (diffusion of dopants, thermal shock, etc.) of the other layers during the subsequent epitaxial growth step are reduced. In addition, since etching is performed to form the semiconductor laser structures on the same substrate, a multi-wavelength semiconductor laser device in which the respective laser structures are highly aligned, can be produced.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Detailed description will be made of the preferred embodiment of the present invention with reference to the accompanying drawings.

FIGS. 2a to 2l are cross-sectional views illustrating the overall procedure of a method for producing a three-wavelength semiconductor laser device according to a preferred embodiment of the present invention.

Figure 1A:
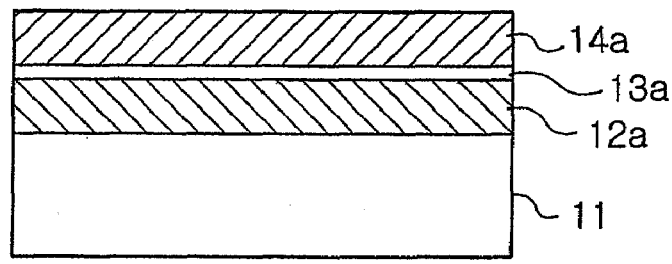
FIGS. 1a to 1g are cross-sectional views illustrating the overall procedure of a conventional method for producing a two-wavelength semiconductor laser device.
Figure 1B:
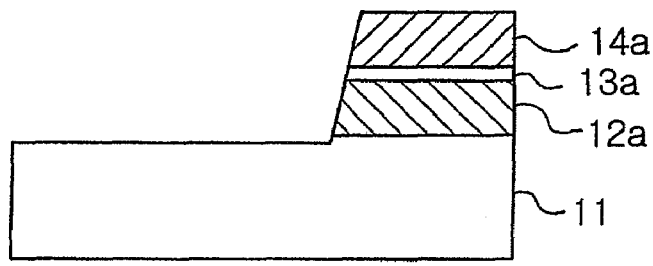
Figure 1C:
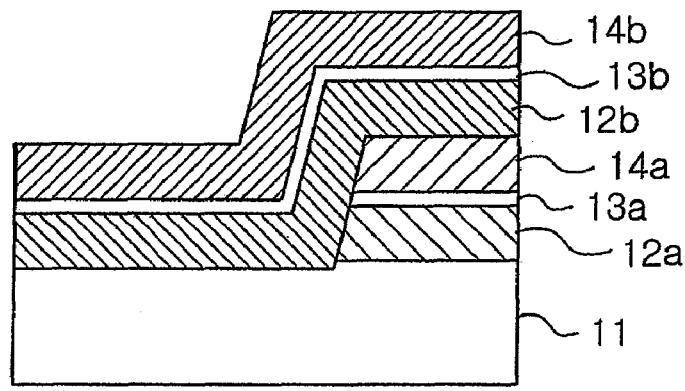
Figure 1D:
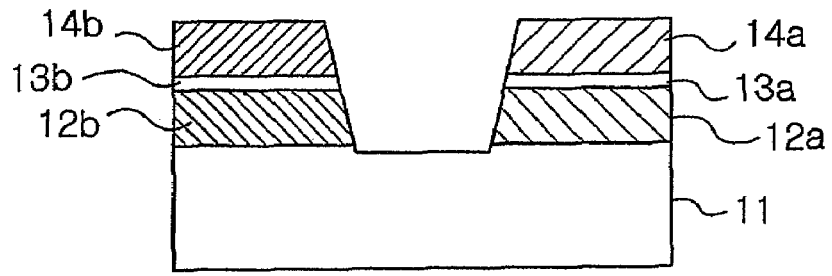
Figure 1E:
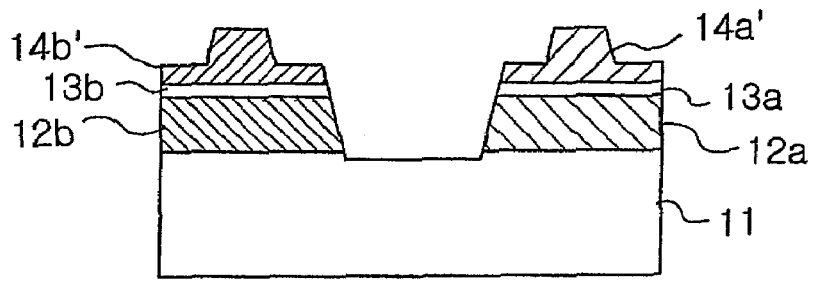
Figure 1F:
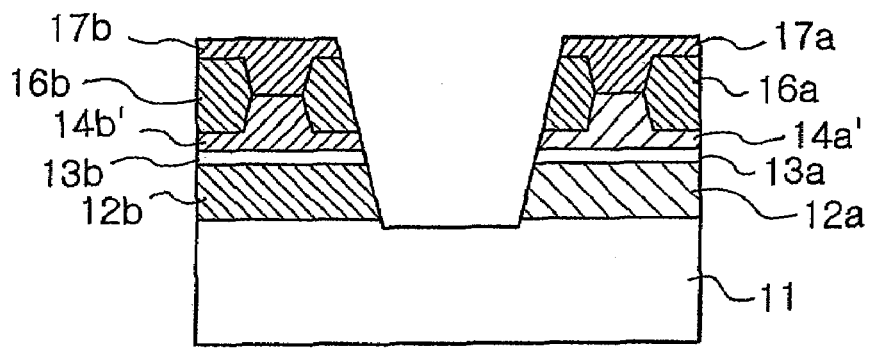
Figure 1G:
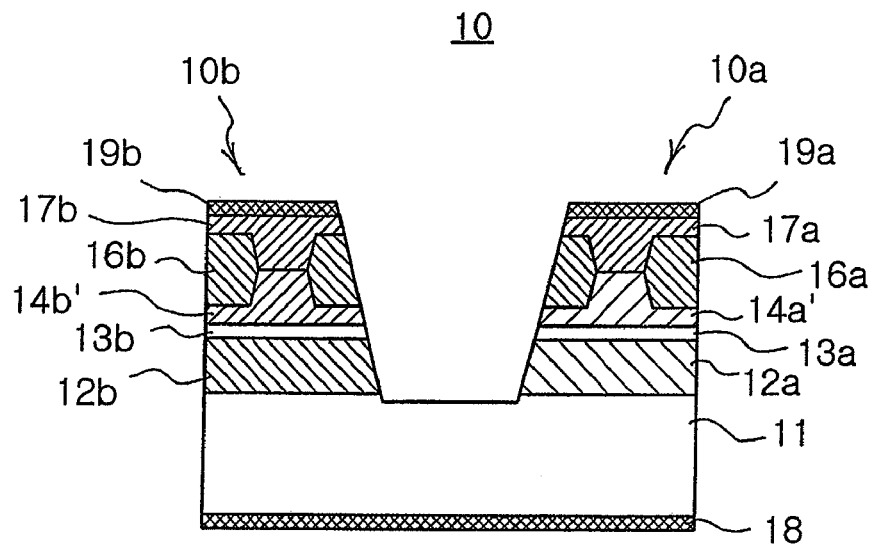
Figure 2A:
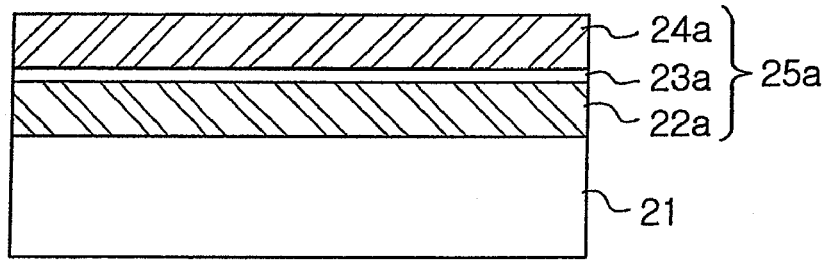
FIGS. 2a to 2l are cross-sectional views illustrating the overall procedure of a method for producing a three-wavelength semiconductor laser device according to the present invention.

As shown in FIG. 2a, a first nitride epitaxial layer 25a for a semiconductor laser structure oscillating light of a short wavelength (e.g., 460 nm) is formed on a sapphire substrate 21. The first nitride epitaxial layer 25a can be formed by sequentially growing a first conductivity-type first clad layer 22a, a first active layer 23a and a second conductivity-type first clad layer 24a. The first conductivity-type first clad layer 22a may be composed of an n-type $Al_{0.1}Ga_{0.9}N$ layer and an n-type GaN layer, and the second conductivity-type first clad layer 24a may be composed of a p-type $Al_{0.2}Ga_{0.8}N$ layer and a p-type GaN layer. The active layer 23a may have a multi-quantum well structure formed of $In_{0.2}Ga_{0.8}N/In_{0.05}Ga_{0.95}N$.

Figure 2B:
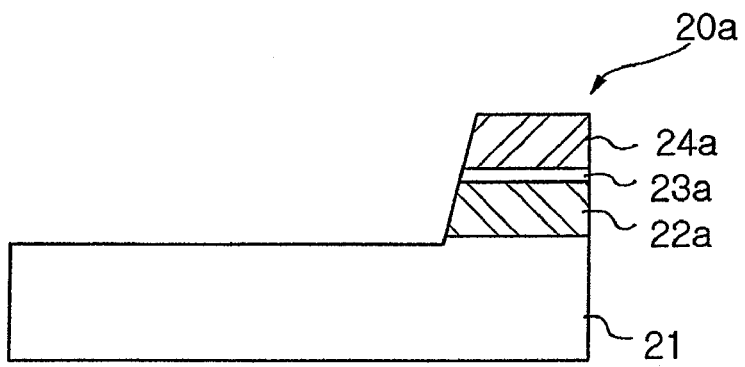

Thereafter, as shown in FIG. 2b, the first nitride epitaxial layer 25a is selectively etched by photolithography and dry etching such that a portion of the top surface of the substrate 21 is exposed. The first nitride epitaxial layer 25a is removed in such a manner that a first semiconductor laser structure 21a remains on the sapphire substrate 21, but is not limited to the structure shown in FIG. 2b.

Figure 2C:
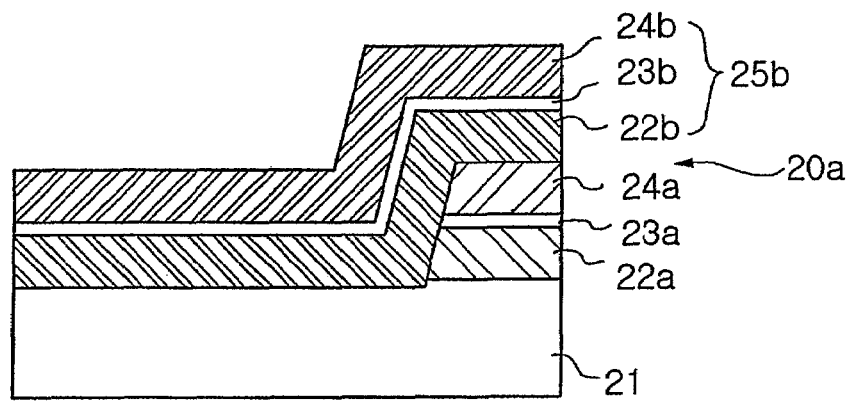

Next, as shown in FIG. 2c, a second nitride epitaxial layer 25b for a second semiconductor laser structure is formed on the exposed top surface of the sapphire substrate 21 and the first semiconductor laser structure 20a. The second nitride epitaxial layer 25b for a second semiconductor laser structure is formed by sequentially growing a first conductivity-type second clad layer 22b, a second active layer 23b and a second conductivity-type second clad layer 24b. In the case where the second nitride epitaxial layer 25b is designed for a semiconductor laser structure oscillating light at a wavelength of 530 nm, the first conductivity-type second clad layer 22b may be composed of an n-type $Al_{0.1}Ga_{0.9}N$ layer and an n-type GaN layer, and the second conductivity-type second clad layer 24a may be composed of a p-type $Al_{0.2}Ga_{0.8}N$ layer and a p-type GaN layer. The active layer 23b may have a multi-quantum well structure formed of $In_{0.2}Ga_{0.8}N/In_{0.05}Ga_{0.95}N$.

Figure 2D:
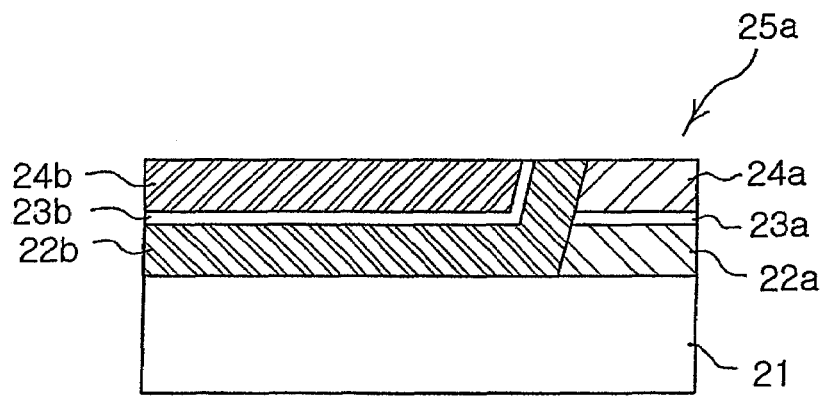

Additionally, in order to make subsequent separation and attachment steps easier, the portion of the second nitride epitaxial layer 25b formed on the first nitride epitaxial layer 25a is removed, and then the top surface of the first 25a and second nitride epitaxial layers 25b is planarized, as shown in FIG. 2d, to form a nitride epitaxial layer 25 for both first and second semiconductor laser structures.

The first and second nitride epitaxial layers 25a and 25b can be formed by conventional growth processes, e.g., metal organic chemical vapor deposition (MOCVD) and molecular beam epitaxial (MBE) deposition. Instead of the sapphire substrate 21, known substrates for growth of a nitride semiconductor, for example, GaN and SiC substrates, can be used.

Figure 2E:
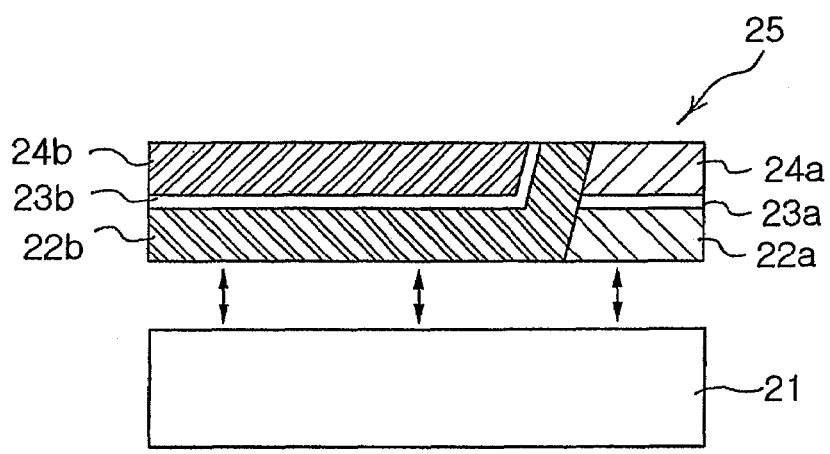

As shown in FIG. 2e, the nitride epitaxial layer 25 is separated from the sapphire substrate 21. This separation can be performed by well-known processes, such as lift-off, dry-etching, lapping and combinations thereof. For example, the lift-off process using laser light can be performed by irradiating the bottom surface of the substrate 21 with an Nd-YAG laser at 5 eV or higher to melt a crystal layer present in the vicinity of the interface between the nitride epitaxial layer 25 and the sapphire substrate 21, thereby easily lifting-off the nitride epitaxial layer 25. On the other hand, these dry-etching or lapping processes can be used to chemically or mechanically separate the sapphire substrate 21. In addition, the dry-etching or lapping process can be combined with the lift-off process using laser light. As a preferred example, the thickness of the substrate 21 is decreased by the lapping process, and then the nitride epitaxial layer 25 is separated from the substrate 21 by laser irradiation.

Figure 2F:
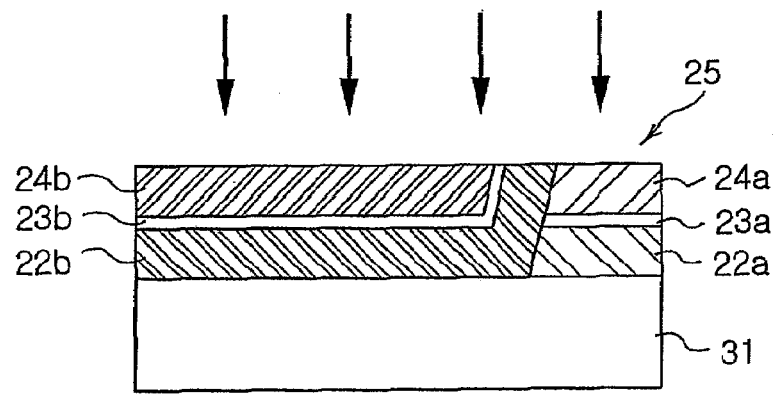

Next, as shown in FIG. 2f, the separated nitride epitaxial layer 25 is attached to a first conductivity-type substrate 31. The first conductivity-type substrate 31 may be an n-type GaAs substrate suitable as a substrate for growth of an epitaxial layer to be grown later. This attachment may be performed using a conductive adhesive, but is preferably performed by applying a predetermined pressure to the separated nitride epitaxial layer 25 on the first conductivity-type substrate 31 at high temperature. For example, the nitride epitaxial layer 25 is arranged on the first conductivity-type substrate 31, and then the resulting structure is heated at 500° C. for about 20 minutes under a pressure of at 5 kg/cm² to attach the nitride epitaxial layer 25 to the n-type GaAs substrate 31. This produces an adhesive free, heat bond between the nitride epitaxial layer 25a and the n-type GaAs substrate 31.

Figure 2G:
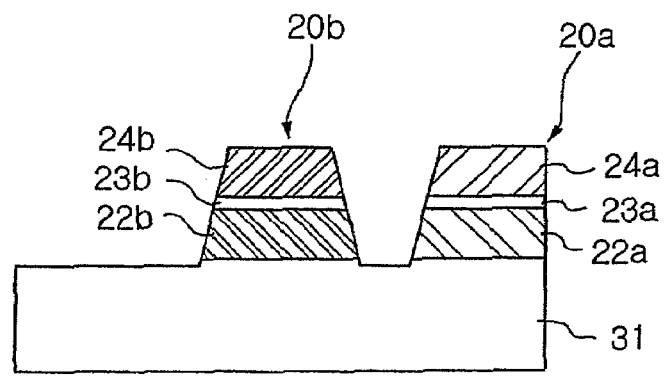

Thereafter, as shown in FIG. 2g, the nitride epitaxial layer (25 in FIG. 2e) is selectively removed by photolithography and dry etching to expose portions of the first conductivity-type substrate 31, and at the same time, to form respective first and second semiconductor laser structures 20a and 20b separated from the first and the second nitride epitaxial layers 25a and 25b. The top surface of the first conductivity-type substrate 31 exposed by etching is provided as a region where a third semiconductor laser structure is formed through subsequent steps.

Specifically, a first conductivity-type third clad layer 22c, a third active layer 23c and a second conductivity-type third clad layer 24c are sequentially grown on the exposed surface of the first conductivity-type substrate 31 such that the first and the second semiconductor laser structures 20a and 20b are separated from each other. In this manner, a third semiconductor laser structure 20c is formed on the first conductivity-type substrate (see, FIG. 2i).

The formation of the third semiconductor laser structure will be explained below with reference to FIGS. 2h and 2i.

Figure 2H:
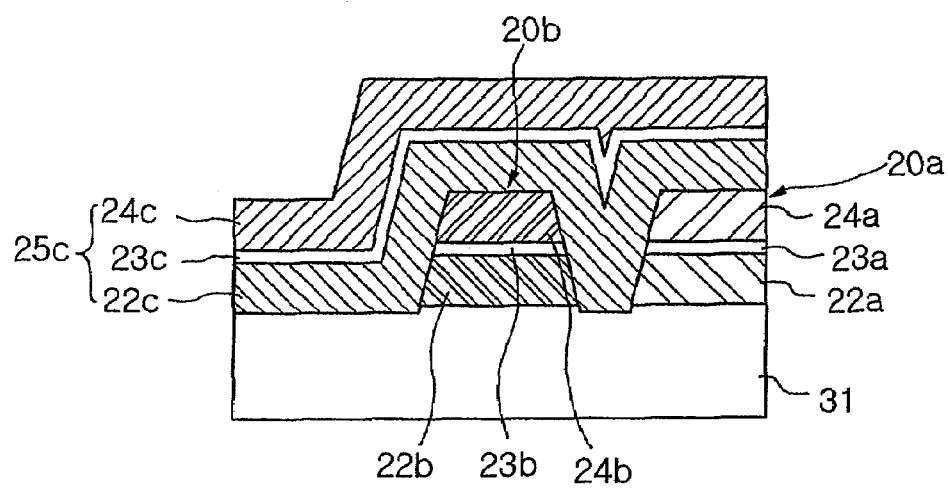

Next, an epitaxial layer 25c for the third semiconductor laser structure is formed on the first conductivity-type substrate 31 on which the first and second semiconductor laser structures 20a and 20b are formed, as shown in FIG. 2h. The epitaxial layer 25c for the third semiconductor laser structure can be formed by sequentially growing the first conductivity-type third clad layer 22c, the third active layer 23c and the second conductivity-type third clad layer 24c. In the case where the epitaxial layer 25c is designed for a semiconductor laser structure oscillating light at a wavelength of 635 nm, the first and second conductivity-type third clad layers 22c and 24c may be composed of n-type and p-type $(Al_{0.7}Ga_{0.3})_{0.5}In_{0.5}P$ layers, respectively. The active layer 23c may have a multi-quantum well structure composed of an InGaP/$(Al_{0.5}Ga_{0.5})_{0.5}In_{0.5}P$ layer.

Figure 2I:
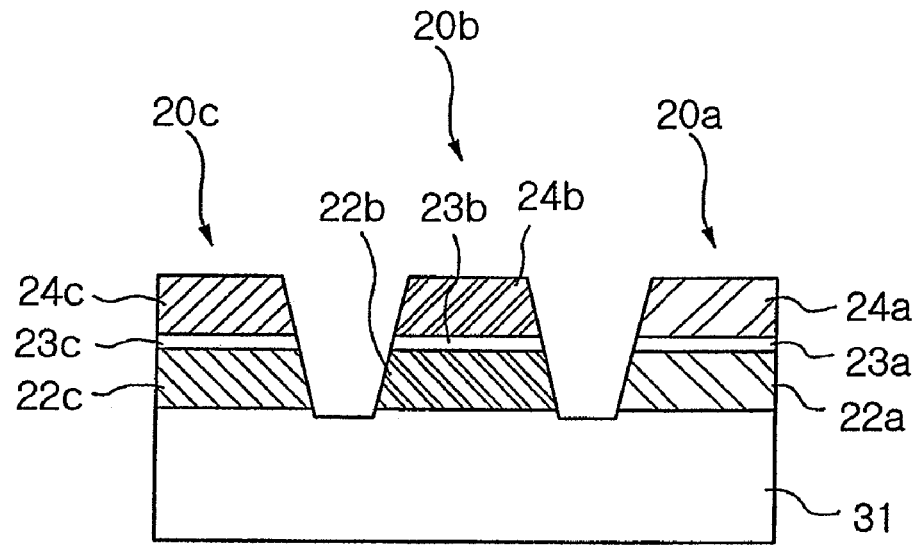

Thereafter, as shown in FIG. 2i, the AlGaInP-based epitaxial layer 25c is selectively etched in such a manner that the third semiconductor laser structure 20c is formed on one region of the top surface of the first conductivity-type substrate 31 except for the regions where the first and second semiconductor laser structures 20a and 20b are formed. Portions of the AlGaInP-based epitaxial layer 25c formed on the top surfaces of the first and the second semiconductor laser structures 20a and 20b and between the respective semiconductor laser structures 20a, 20b and 20c are selectively removed by etching, such that the first, second and third semiconductor laser structures 20a, 20b and 20c are separated from one another.

Figure 2J:
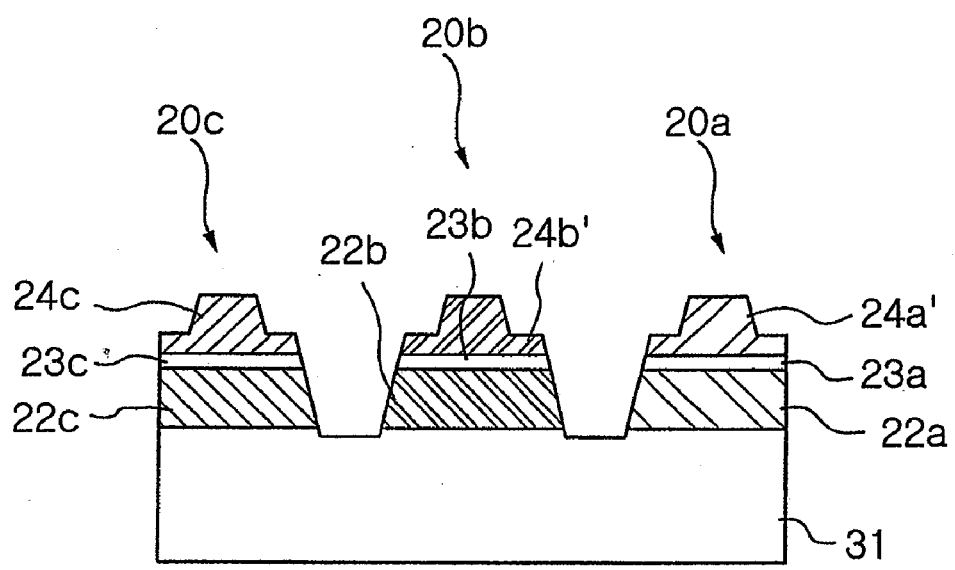

In addition, etching is preferably performed to form the respective second conductivity-type clad layers 24a, 24b and 24c of the first, the second and the third semiconductor laser structures 20a, 20b and 20c into ridge-shaped layers 24a', 24b' and 24c', as shown in FIG. 2j. The width between the ridge-shaped layers may be about 2 μm to about 7 μm. This ridge structure can increase the efficiency of current injected through the second conductivity-type clad layers 24a, 24b and 24c.

Figure 2K:
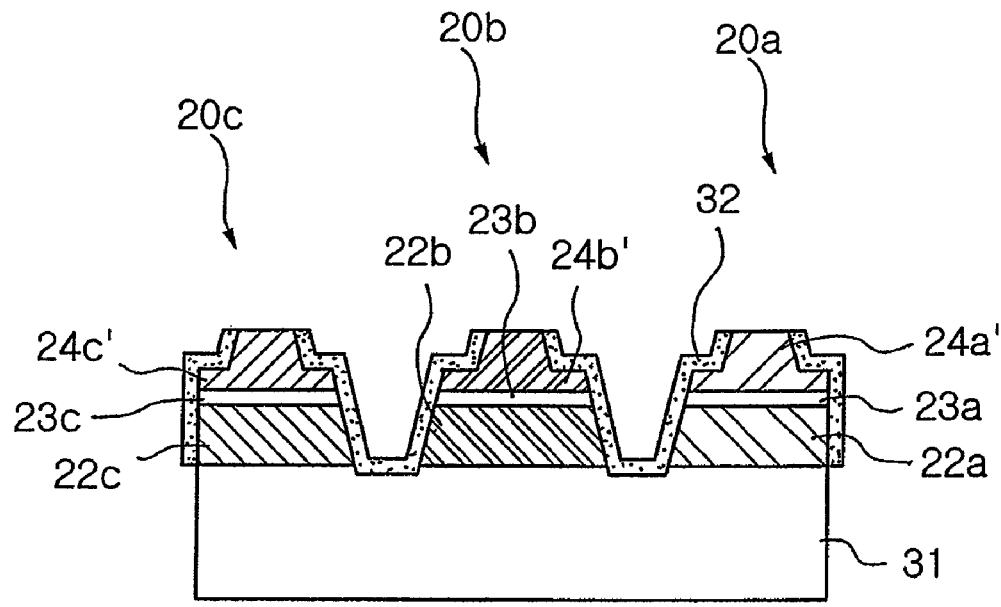

Next, as shown in FIG. 2k, an insulating layer 32 is formed on the top surfaces of the second conductivity-type clad layers 24a, 24b and 24c except for top ends of the ridge-shaped layers. The insulating layer 32 acts as a current-limiting layer. Preferably, the insulating layer 32 may be formed in such a manner that it is extended to side faces of the first, second and third semiconductor laser structures and the overall faces of the substrate 31. Thus, the insulating layer 32 can be used as a common passivation layer, as well as a current-limiting layer. The insulating layer 32 may be formed of $SiO_2$ or $Si_3N_4$.

Figure 2L:
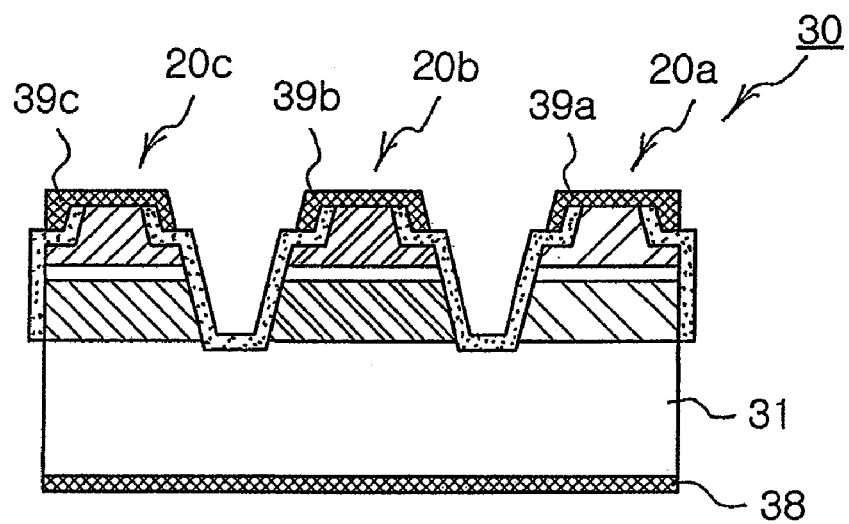

Referring finally to FIG. 2l, a first electrode 38 is formed on a bottom surface of the first conductivity-type substrate 31, and second electrodes 39a, 39b and 39c are formed in such a manner that they are connected to the respective second conductivity-type clad layers 24a, 24b and 24c of the first, second and third semiconductor laser structures 20a, 20b and 20c. In this embodiment, the second electrodes 39a, 39b and 39c can be formed on top surfaces of the respective semiconductor laser structures 20a, 20b and 20c such that they are connected to the respective second conductivity-type clad layers 24a, 24b and 24c through the tops surfaces of the ridge-shaped layers. The first electrode 38 may be formed of AuGe, Au, Ni or an alloy thereof, and the second electrodes 39a, 39b and 39c may be formed of at least one metal selected from the group consisting of Ti, EPt, Ni and Au. In this manner, a three-wavelength semiconductor laser device 30 in which the three semiconductor laser structures 20a, 20b and 20c oscillating light of the respective inherent wavelengths are arranged on the same substrate 31, can be produced.

As shown in FIG. 2l, according to the semiconductor laser device 30 capable of oscillating three-wavelength light of the three primary colors (red, green and blue), the first semiconductor laser structure 20a formed of a first GaN-based material, the second semiconductor laser structure 20b formed of a second GaN-based material, and the third semiconductor laser structure 20c formed of an AlGaIn-based material can be integrated into one chip. The first and second semiconductor laser structures 20a and 20b are grown on a separate substrate for growth of a nitride semiconductor, separated from the substrate and attached to the first conductivity-type substrate 31. For easy growth of the third semiconductor laser structure 20c, the first semiconductor laser structure 20a is preferably arranged at one side of the first conductivity-type substrate 31. Furthermore, the second and third semiconductor laser structures 20b and 20c are preferably arranged in this order in order that they grow from the side where the first semiconductor laser structure 20a is arranged.

In the case where ridge-shaped layers and a current-limiting layer are employed, the insulating layer 32 of the respective second conductivity-type clad layers 24a, 24b and 24c is provided as a current-limiting layer. Since the second conductivity-type first clad layers (formed of a GaN-based material) are grown under different conditions, a conventional current-limiting layer formed by reverse attachment has a limitation in its simultaneous formation on the three semiconductor laser structures. Accordingly, the present invention suggests the use of the insulating layer 32 as a current-limiting layer to simultaneously form the current-limiting layer on the three semiconductor laser structures. The insulating layer is extended to side faces of the respective semiconductor laser structures, and thus acts as a passivation layer of the respective semiconductor laser structures.

Although the present invention has been described herein with reference to the foregoing examples and the accompanying drawings, the scope of the present invention is defined by the claims that follow. Accordingly, those skilled in the art will appreciate that various substitutions, modifications and changes are possible, without departing from the technical spirit of the present invention as disclosed in the accompanying claims. It is to be understood that such substitutions, modifications and changes are within the scope of the present invention.

As apparent from the above description, according to the method for producing a multi-wavelength semiconductor laser device oscillating red, green and blue light, after first and second GaN-based semiconductor laser structures are grown in parallel on a substrate for growth of a nitride semiconductor, separated from the substrate and attached to a first conductivity-type substrate (e.g., a GaAs substrate), another semiconductor laser structure oscillating light of a different wavelength is formed on the first conductivity-type substrate. Accordingly, the semiconductor laser structures, which cannot be grown on a single substrate, can be integrated into one chip.

In addition, since epitaxial layers for the respective semiconductor laser structures are formed on the final substrate, the three-wavelength semiconductor laser device can be produced in a simpler manner, without causing poor alignment during attachment of the semiconductor laser structures.

What is claimed is:

1. A method for producing a multi-wavelength semiconductor laser device, comprising the steps of:
   preparing a substrate for growth of a nitride single crystal thereon;
   sequentially growing a first conductivity-type first clad layer, a first active layer and a second conductivity-type first clad layer on the substrate, to form a first nitride epitaxial layer;

selectively removing the first nitride epitaxial layer such that a portion of the substrate is exposed;

sequentially growing a first conductivity-type second clad layer, a second active layer and a second conductivity-type second clad layer on the exposed portion of the substrate, to form a second nitride epitaxial layer;

separating the first and second nitride epitaxial layers from the substrate;

attaching the separated first and second nitride epitaxial layers to a first conductivity type substrate;

selectively etching the first and second nitride semiconductor epitaxial layers to expose a portion of the first conductivity-type substrate and to form first and second semiconductor laser structures from the first and second nitride epitaxial layers, respectively, the first and second semiconductor laser structures being separated from each other;

sequentially growing a first conductivity-type third clad layer, a third active layer and a second conductivity-type third clad layer on the exposed portion of the first conductivity-type substrate, to form a third semiconductor laser structure; and forming a first electrode connected to a bottom surface of the first conductivity-type substrate and forming second electrodes connected to the respective second conductivity-type clad layers of the first, second and third semiconductor laser structures.

2. The method according to claim 1, further comprising the steps of: selectively etching the respective second conductivity-type clad layers of the first, second and third semiconductor laser structures, after the formation of the third semiconductor laser structure and before the formation of the first electrode and the second electrodes, to form ridge-shaped layers; and forming an insulating layer on top surfaces of the second conductivity-type clad layers except for top ends of the ridge-layers, wherein the second electrodes are connected to the respective second conductivity-type clad layers through the respective top ends of the ridge-shaped layers.

3. The method according to claim 2, wherein the insulating layer is formed in such a manner that it is extended to side faces of the first, second and third semiconductor laser structures.

4. The method according to claim 2, wherein the insulating layer is formed of SiO2 or SiN4.

5. The method according to claim 1, wherein the separation of the first and second nitride epitaxial layers from the substrate is performed by irradiating the bottom surface of the substrate with laser light to lift-off the first and second nitride epitaxial layers.

6. The method according to claim 5, wherein the step of separating the first and second nitride epitaxial layers comprises the sub-step of lapping the bottom surface of the substrate, before the laser irradiation, to decrease the thickness of the substrate.

7. The method according to claim 1, wherein the attachment of the first and second nitride epitaxial layers to the first conductivity-type substrate is performed by pressuring the first and second nitride epitaxial layers on a top surface of the first conductivity-type substrate at high temperature.

8. The method according to claim 1, wherein the etching of the first nitride semiconductor layer leaves an epitaxial layer for the first semiconductor laser structure.

9. The method according to claim 1, wherein the step of forming the third semiconductor laser structure comprises the sub-steps of:

sequentially growing the first conductivity-type third clad layer, the third active layer and the second conductivity-type third clad layer on the top surface of the first conductivity-type substrate on which the first and second semiconductor laser structures are formed, to form an epitaxial layer for the third semiconductor laser structure; and selectively etching the epitaxial layer for the third semiconductor laser structure, to form the third semiconductor laser structure from the first and second semiconductor laser structures on a portion of the first conductivity-type substrate.

10. The method according to claim 1, wherein the first, second and third semiconductor laser structures are formed in this order from one side of the first conductivity-type substrate.

11. The method according to claim 1, wherein the substrate for growth of a nitride single crystal is a sapphire, SiC, or GaN substrate.

12. The method according to claim 1, wherein the first nitride epitaxial layer is formed of a GaN-based semiconductor material for a semiconductor laser structure oscillating blue light, and the second nitride epitaxial layer is formed of a GaN-based semiconductor material for a semiconductor laser structure oscillating green light.

13. The method according to claim 1, wherein the third semiconductor laser structure is formed from an epitaxial layer made of an AlGaInP-based semiconductor material.

* * * * *